(12) United States Patent
Chu et al.

(10) Patent No.: US 9,336,865 B1
(45) Date of Patent: May 10, 2016

(54) MULTI-PORT SRAM MODULE AND CONTROL METHOD THEREOF

(71) Applicant: M31 TECHNOLOGY CORPORATION, Hsinchu County (TW)

(72) Inventors: Li-Wei Chu, New Taipei (TW); Nan-Chun Lien, Taipei (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 14/827,719

(22) Filed: Aug. 17, 2015

(30) Foreign Application Priority Data

Jun. 2, 2015 (TW) .............................. 104117723 A

(51) Int. Cl.
*G11C 8/00* (2006.01)
*G11C 7/00* (2006.01)
*G11C 11/419* (2006.01)

(52) U.S. Cl.
CPC ................................... *G11C 11/419* (2013.01)

(58) Field of Classification Search
CPC ...... G11C 8/16; G11C 11/412; G11C 11/419; G11C 11/413; G11C 5/063; G11C 7/1075; G11C 11/418; G11C 11/40; G11C 7/12; G11C 8/10; G11C 7/00
See application file for complete search history.

(56) References Cited

U.S. PATENT DOCUMENTS

| 6,778,462 | B1 * | 8/2004 | Castagnetti | G11C 8/14 365/230.05 |
| 7,443,747 | B2 * | 10/2008 | Lien | G11C 8/063 365/154 |
| 7,894,296 | B2 * | 2/2011 | Lee | G11C 8/16 365/189.04 |
| 8,339,893 | B2 * | 12/2012 | Chan | G11C 8/16 365/154 |
| 9,208,853 | B2 * | 12/2015 | Kolar | G11C 8/16 |

OTHER PUBLICATIONS

Jui-Jen Wu et al., "A 45-nm Dual-Port SRAM Utilizing Write-Assist Cells Against Simultaneous Access Disturbances", IEEE Transactions on Circuits and Systems—II: Express Briefs, vol. 59, No. 11, Nov. 2012.
Koji Nii et al., "Synchronous Ultra-High-Density 2RW Dual-Port 8T-SRAM With Circumvention of Simultaneous Common-Row-Access", IEEE Journal of Solid-State Circuits, vol. 44, No. 3, Mar. 2009.
Nan-Chun Lien et al., "Method for Resolving Simultaneous Same-Row Access in Dual-Port 8T SRAM with Asynchronous Dual-Clock Operation", IEEE.

* cited by examiner

*Primary Examiner* — Hien Nguyen
(74) *Attorney, Agent, or Firm* — WPAT, P.C., Intellectual Property Attorneys; Anthony King

(57) ABSTRACT

A multi-port SRAM module includes a cell array comprising a plurality of cells, each having a first port and a second port; a first word line which is coupled to a plurality of cells of a target row to open and close the first port; a second word line which is coupled to the cells of the target row to open and close the second port; and a switch, which is coupled to the first word line and the second word line and couples the second word line to a reference voltage level according to a voltage level of the first word line.

17 Claims, 10 Drawing Sheets

MULTI-PORT SRAM MODULE AND CONTROL METHOD THEREOF

BACKGROUND OF THE INVENTION

1. Field of the Invention

The present invention relates to an SRAM (static random access memory), especially to a multi-port SRAM module.

2. Description of Related Art

FIG. 1 illustrates a circuit of a conventional dual port SRAM module. This figure shows a plurality of dual port memory cells 110 situated at the same row of a memory cell array in the dual port SRAM module. The dual port memory cells 110 are all connected to the same group of word lines WLA and WLB but each is connected to different bit line pairs PBLA and PBLB, each of which includes 2 bit lines. FIG. 2 illustrates a circuit of the dual port memory cell 110, which is typically made of 8 transistors. 4 of the 8 transistors form a latch 112, 2 transistors 113 and 114 form one port of the dual port memory cell 110, which is connected to the word line WLA, and the other 2 transistors 115 and 116 form the other port of the dual port memory cell 110, which is connected to the word line WLB. The word line WLA controls whether one port is open or close, namely, whether or not the latch 112 is connected to the bit line pair PBLA (including a bit line BLA and a bit line/BLA); the word line WLB controls whether the other port is open or close, namely, whether or not the latch 112 is connected to the bit line pair PBLB (including bit line BLB and bit line/BLB). Referring back to FIG. 1, the word line WLA and the word line WLB are respectively driven by an inverter 120 and an inverter 130. The output of the inverter 120 is coupled to one port of the dual port memory cell 110 and the output of the inverter 130 is coupled to the other port of the dual port memory cell 110. A dual port SRAM has advantages of enhanced access speed but also has some disadvantages, such as (a) the latch 112 suffering double read disturb as the dual port memory cell 110 being read through both bit lines pairs PBLA and PBLB at the same time, which degrades read static noise margin (RSNM); (b) as a read operation and a write operation being performed on a dual port memory cell 110 at the same time, the write margin is degraded because a write current competes with a read current; and (c) when two word lines WLA and WLB of the same row are asserted at the same time, a dual port memory cell 110 in a data-retaining state suffering from a high possibility of data loss of the latch due to increased leakage current.

SUMMARY OF THE INVENTION

In view of the problems of the prior art, an object of the present invention is to provide a multi-port SRAM module and a method of controlling a multi-port SRAM module to increase stability of read and/or write operations, so as to make an improvement to the prior art.

The present invention discloses a multi-port SRAM module which comprises a memory cell array, a first word line, a second word line and a switch. The memory cell array includes a plurality of memory cells, each of which comprises at least a first port and a second port. The first word line, coupled to a plurality of memory cells of a target row, controls whether the first port is open or not. The second word line, coupled to the plurality of memory cells of the target row, controls whether the second port is open or not. The switch, coupled to the first word line and the second word line, determines whether to couple the second word line to a reference voltage level according to a voltage level of the first word line. When the first word line is disabled and the second word line is enabled, the second word line has a first enabling voltage level, and when the first word line and the second word line are enabled at the same time, the second word line has a second enabling voltage level different from the first enabling voltage level.

The present invention also discloses a multi-port SRAM module which comprises a memory cell array, a first word line, a second word line and a detection circuit. The memory cell array comprises a plurality of memory cells, each of which comprises at least a first port and a second port. The first word line, coupled to a plurality of memory cells of a target row, controls whether the first port is open or not. The second word line, coupled to the plurality of memory cells of the target row, controls whether the second port is open or not. The detection circuit, coupled to the first word line and the second word line, detects the voltage levels of the first word line and the second word line to generate a detection result. According to the detection result, the voltage levels of the memory cells of the target row are adjusted or a voltage level of a bit line is adjusted. The bit line is connected to the first port or the second port.

The present invention further discloses a method of controlling a multi-port SRAM. The multi-port SRAM comprises a first word line and a second word line. The first word line and the second word line are respectively used to control whether or not a first port and a second port of a plurality of memory cells of the same row are open. The method comprises the following steps: adjusting a voltage level of the second word line according to a voltage level of the first word line. When the first word line is disabled and the second word line is enabled, the second word line has a first enabling voltage level, and when the first word line and the second word line are enabled at the same time, the second word line has a second enabling voltage level different from the first enabling voltage level.

The multi-port SRAM module and the method of controlling the multi-port SRAM module increases stability of read and/or write operations of the multi-port SRAM module by using simple circuits to determine when to adjust the voltage levels of the multi-port SRAM module, such as the word line voltage level, the bit line voltage level, and/or the memory cell voltage level. In addition, the multi-port SRAM module further has advantages of asynchronous operation (i.e., allowing clock skew to exist between different ports), no need of additional addressing matching circuits and/or arbiter circuits, and small circuit areas.

These and other objectives of the present invention no doubt becomes obvious to those of ordinary skill in the art after reading the following detailed description of the preferred embodiments that are illustrated in the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 3:
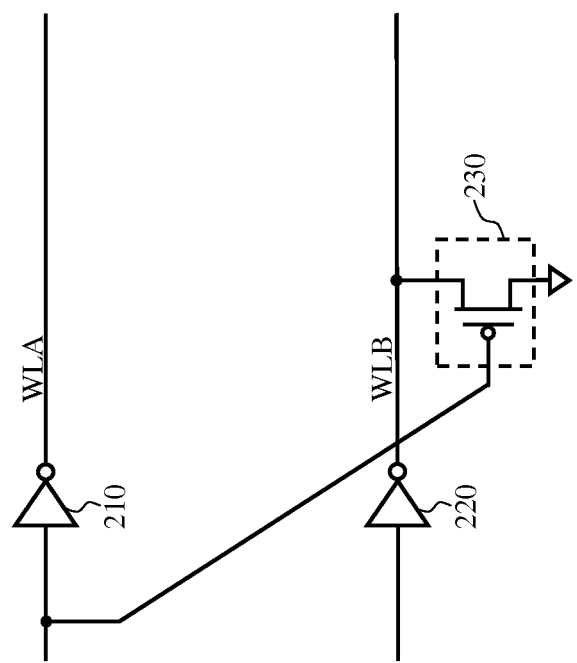
FIG. 3 illustrates a partial circuit of a multi-port SRAM module according to an embodiment of the present invention.
Figure 4:
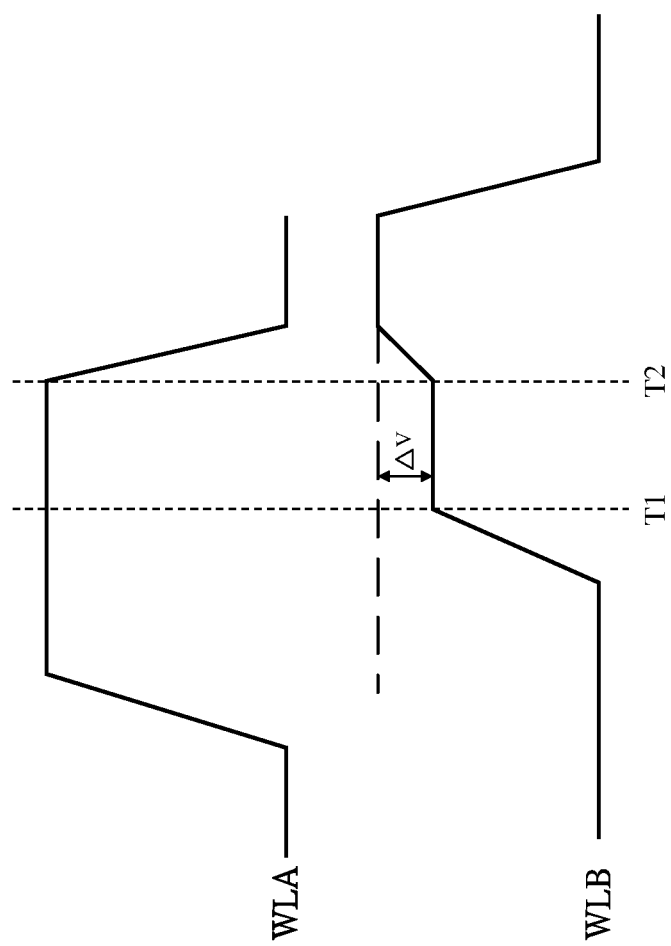
FIG. 4 illustrates a timing sequence of two word lines that have dependency.

FIG. 3 illustrates a partial circuit of a multi-port SRAM module according to an embodiment of the present invention. This invention is applicable to SRAM with at least 2 ports, namely, any row of a multi-port SRAM module including at least 2 word lines. The word lines WLA and WLB shown in FIG. 3 are 2 of them, which are respectively driven by an inverter 210 and an inverter 220. At the output of the inverter 220, the word line WLB is coupled to a reference voltage level through a switch 230. The reference voltage level is lower than an enabling voltage of the word line WLB when it is enabled (e.g., a logic high level as being enabled). In one embodiment, the reference voltage level is a ground voltage level. The switch 230 switches on and off according to the voltage level of the word line WLA; as a result, the voltage level of the word line WLB is affected by the voltage level of the word line WLA. In other words, the voltage level of the word line WLB is dependent on the voltage level of the word line WLA (this illustrative example being a one-way dependency, i.e., the voltage level of the word line WLB being affected by the voltage level of the word line WLA, but the voltage level of the word line WLA not affected by the voltage level of the word line WLB). As shown in FIG. 3, when the switch 230 is implemented by a PMOS, the gate of the PMOS is coupled to an input terminal of the inverter 210. Therefore, when the word line WLA is enabled (the input terminal of the inverter 210 being at a logic low level), the switch 230 switches on, causing the voltage level on the word line WLB to be different from its original voltage level. As shown in FIG. 4, the word line WLB has a voltage drop of ΔV between T1 and T2 when the word line WLA is enabled. The word line under-drive (WLUD) resulting from the voltage drop on the word line WLB helps reduce read disturb to prevent data loss. In one embodiment, when a memory cell connected to the word line WLA and the word line WLB uses one of its ports corresponding to the word line WLA (i.e., the port coupled to the output terminal of the inverter 210) for a write operation and its another port corresponding to the word line WLB (i.e., the port coupled to the output terminal of the inverter 220) for a read operation, the read disturb can be alleviated.

The switch 230 can also be implemented by an NMOS with its gate coupled to the output terminal of the inverter 210. The switch 230 can also be a combination of more than one NMOS and/or PMOS, and because such modifications can be perceived by people having ordinary skill in the art, the possible implementations are not enumerated.

Figure 5:
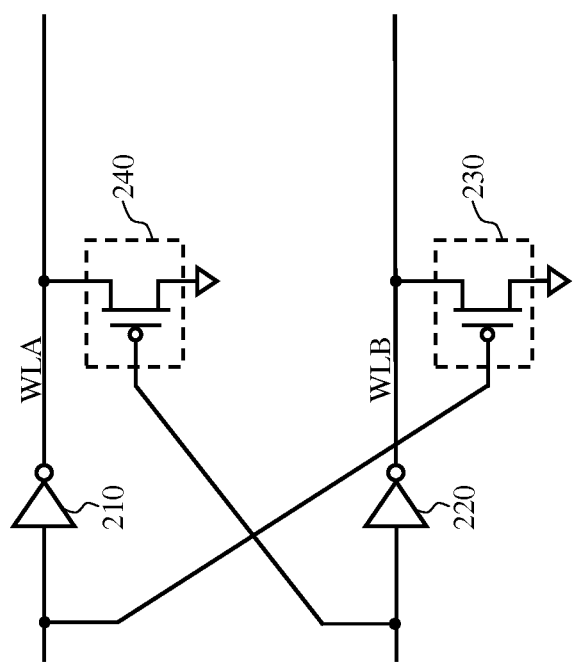
FIG. 5 illustrates a partial circuit of a multi-port SRAM module according to another embodiment of the present invention.
Figure 6:
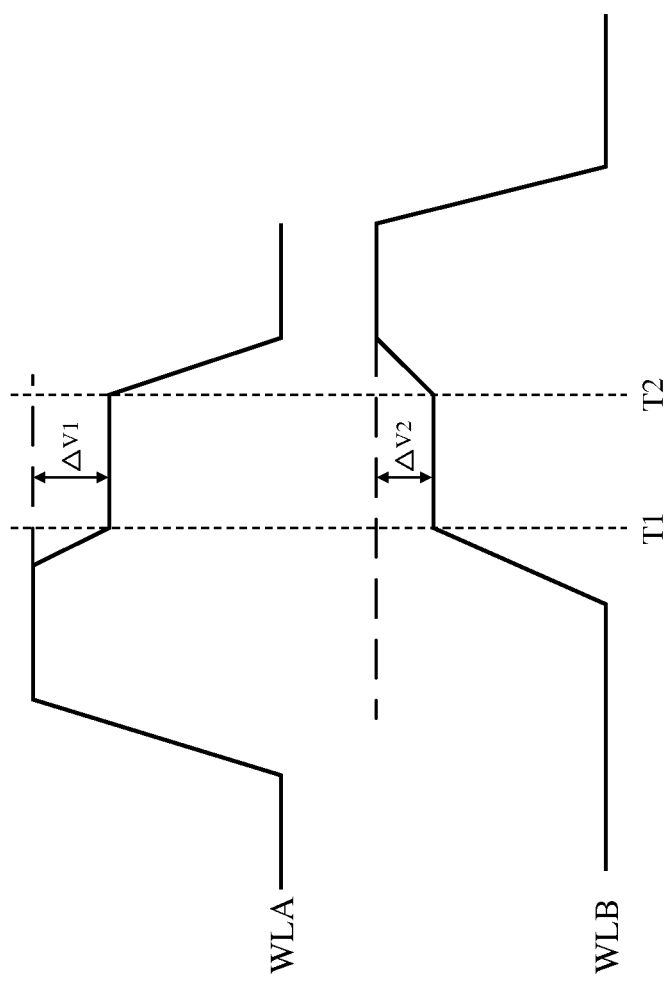
FIG. 6 illustrates another timing sequence of two word lines that have dependency.

FIG. 5 illustrates a partial circuit of a multi-port SRAM module according to another embodiment of the present invention. In addition to having the word line WLB connected to the reference voltage level through the switch 230, in this embodiment the word line WLA is also connected to the reference voltage level through a switch 240. The on/off state of the switch 240 is controlled by the voltage level of the word line WLB. Therefore, there is a mutual dependency between the voltage level of the word line WLA and the voltage level of the word line WLB; namely, the voltage levels of the two word lines affect each other. As shown in FIG. 6, in the interval between T1 and T2 when both word lines WLA and WLB are enabled, the voltage level of the word line WLA is forced to drop ΔV1 as the switch 240 switches on, and similarly, the voltage level of the word line WLB is forced to drop ΔV2 as the switch 230 switches on. The voltage drops ΔV1 and ΔV2 are related respectively to the sizes of the switch 240 and the switch 230, e.g., the aspect ratio of the transistors when the switches 230 and 240 are implemented by NMOS and/or PMOS. Likewise, in addition to a PMOS, the switch 240 can also be implemented by a combination of NMOS and/or PMOS. In brief, when the word line WLA and the word line WLB are enabled at the same time, both of them gain the advantage of WLUD. In comparison with the prior embodiment, this embodiment is able to further suppress the read disturb.

Figure 7:
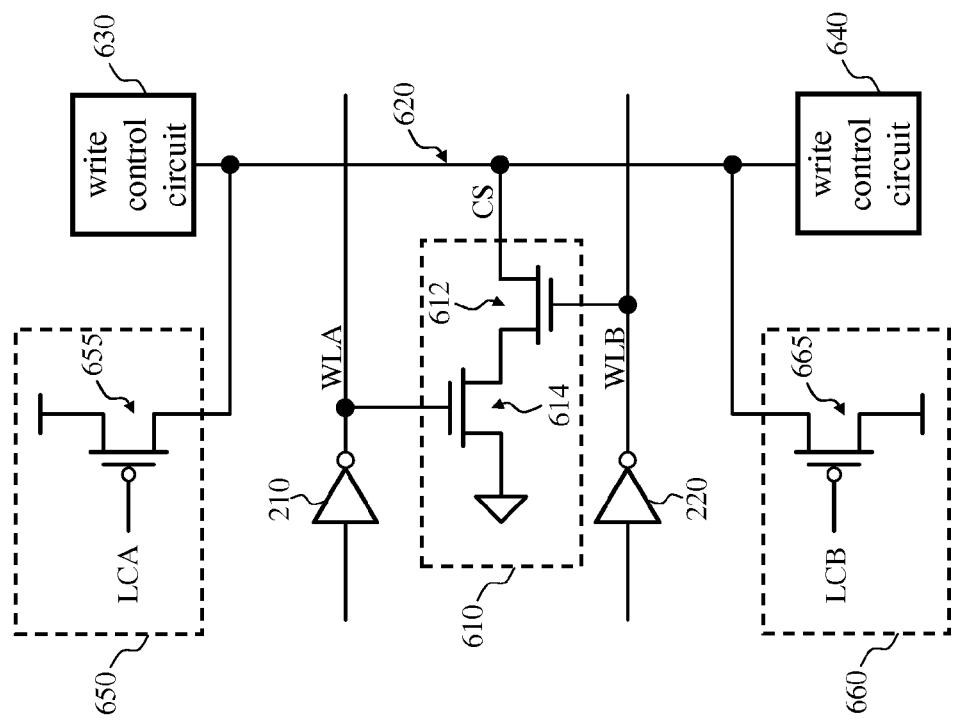
FIG. 7 illustrates a partial circuit of a multi-port SRAM module according to another embodiment of the present invention.

FIG. 7 illustrates a partial circuit of a multi-port SRAM module according to another embodiment of the present invention. In this embodiment, the word line WLA and the word line WLB are both coupled to a detecting circuit 610. The detecting circuit 610 generates a control signal CS according to voltage levels of the word line WLA and the word line WLB. In this embodiment, when the word line WLA and the word line WLB are enabled at the same time, the detecting circuit 610 outputs the control signal CS at a logic low level. The control signal CS is coupled to a write control circuit 630 and a write control circuit 640 through a control line 620. The write control circuit 630 is to drive the bit line pair PBLA while the write control circuit 640 is to drive the bit line pair PBLB. A reset circuit 650 and a reset circuit 660 are coupled to the control line 620 and reset the voltage level of the control line 620 according respectively to the signal LCA and the signal LCB. The signals LCA and LCB are related to an operating frequency of the SRAM module. As a result, at least one of the reset circuits 650 and 660 resets the voltage level of the control line 620 between two consecutive events when multiple word lines of one group (i.e., the word lines coupled to the detecting circuit 610, which are word lines WLA and WLB in this illustrative example) are simultaneously enabled. In this embodiment, the reset circuits 650 and 660 change the voltage level of the control line 620 to a logic high level in the reset process. The reset circuit 650 (660) can be simply implemented by a transistor 655 (665) coupled to a voltage source. When the control signal CS indicates that the word lines WLA and WLB are enabled at the same time, the write control circuit 630 and the write control circuit 640 can selectively decrease the voltage level of their respective bit lines to achieve a negative bit line (NBL) effect that improves stability of the write operation. The detecting circuit 610 can be simply implemented by a combination of transistors (e.g., two NMOSs 612 and 614 connected in series) which is designed to ensure that when the word lines WLA and WLB are enabled at the same time, the control signal CS causes a voltage level of the control line 620 to transit.

Figure 8:
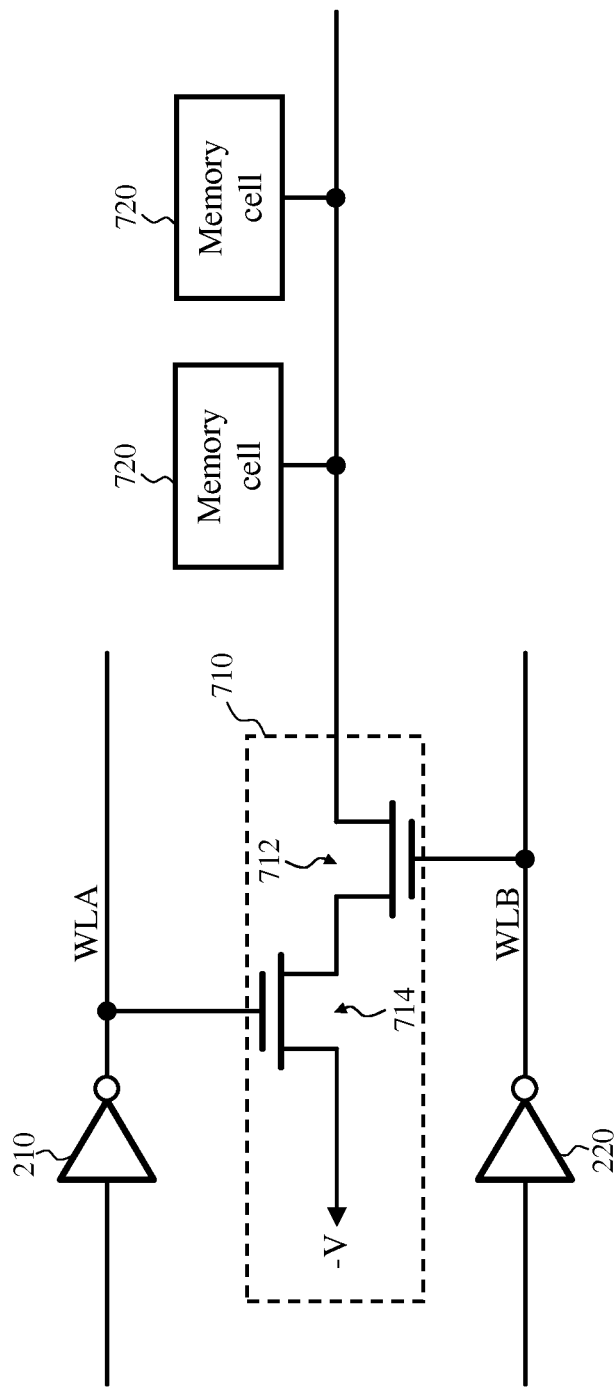
FIG. 8 illustrates a partial circuit of a multi-port SRAM module according to another embodiment of the present invention.

FIG. 8 illustrates a partial circuit of a multi-port SRAM module according to another embodiment of the present invention. In this embodiment, the word line WLA and the word line WLB are both coupled to a voltage adjusting circuit 710. The voltage adjusting circuit 710 determines whether or not to couple a node of a multi-port memory cell 720 to a negative voltage level −V according to whether or not the word line WLA and the word line WLB are enabled. In one embodiment, the node can be a point where a latch of the multi-port memory cell 720 couples a low voltage level; to be specific, if the latch comprises 2 PMOSs and 2 NMOSs, the node is a source of the NMOS, which is coupled to ground in normal operations. The voltage adjusting circuit 710 of this embodiment comprises 2 NMOSs 712 and 714 connected in series. When the word lines WLA and WLB are enabled at the same time, a voltage at the node of the multi-port memory cell 720 is forcibly pulled down to the negative voltage level −V. As a result, when a low voltage level of the latch of the multi-port memory cell 720 is pulled lower than a normal operation voltage level, the multi-port memory cell 720 encounters less read disturb, which improves the RSNM of the multi-port memory cell 720. In an another embodiment, the voltage adjusting circuit 710 is not directly connected to the word lines WLA and WLB, but instead determines whether to change a voltage level of the multi-port memory cell 720 based indirectly on a detection result (e.g., the signal CS) of the detecting circuit 610. In this case, the voltage adjusting circuit 710 can comprise only a transistor, whose gate is coupled to the detecting circuit 610, and the voltage adjusting circuit 710 determines whether to couple the multi-port memory cell 720 to a lower voltage level according to the detection result.

Figure 9:
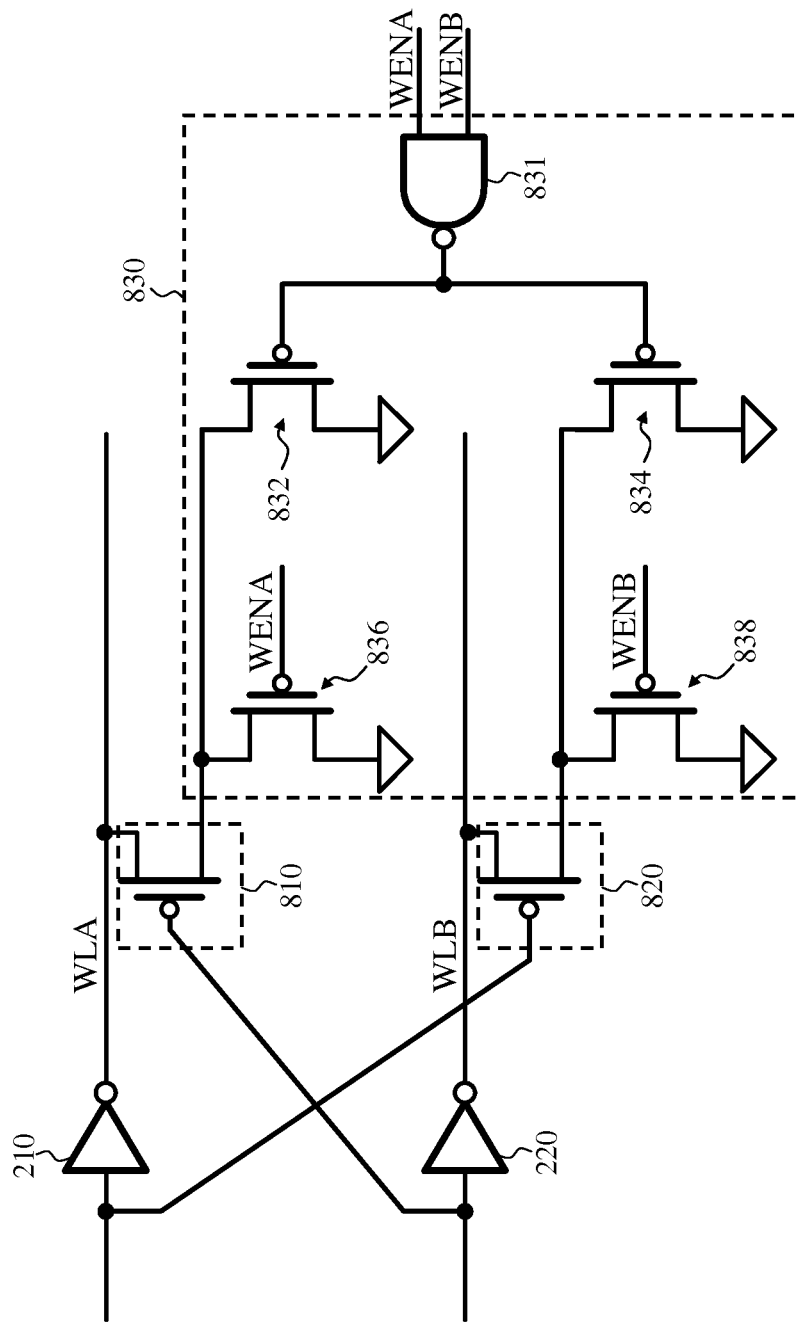
FIG. 9 illustrates a partial circuit of a multi-port SRAM module according to another embodiment of the present invention.

FIG. 9 illustrates a partial circuit of a multi-port SRAM module according to another embodiment of the present invention. The word lines WLA and WLB are coupled to each other through a switch 810 and a switch 820, both of which are coupled to a logic circuit 830. When the word line WLA (WLB) is enabled, the switch 820 (810) switches on and the logic circuit 830 determines whether to apply the WLUD mechanism to corresponding word line(s) according to the read/write control signals WENA and WENB. In this embodiment, the WLUD mechanism is applied to the word line(s) corresponding to the read operation. If both word lines correspond to the write operation at the same time, the WLUD is applied to both word lines. The following table show the combination of operations:

| WENA/WENB | 0/0 | 0/1 | 1/0 | 1/1 |
|---|---|---|---|---|
| WLA | WLUD | WLUD | — | WLUD |
| WLB | WLUD | — | WLUD | WLUD |

A logic value 1 and a logic value 0 of the read/write control signals WENA and WENB correspond respectively to a write operation and a read operation. WLUD indicates that the WLUD mechanism is applied to the corresponding word line. In summary, the design principle of the logic circuit 830 is that when both the word line WLA and the word line WLB correspond to the read operation at the same time, the WLUD mechanism is applied to both of them; when one of them corresponds to the read operation and the other corresponds to the write operation, the WLUD mechanism is applied to only the word line corresponding to the read operation; and when both of them correspond to the write operation, the WLUD mechanism is applied to both of them. Modifications to the combination of read/write operations and the application of the WLUD mechanism can be derived by people having ordinary skill in the art based on this embodiment, and are therefore omitted for brevity. The logic circuit 830 includes a NAND gate 831, 4 transistors 832, 834, 836 and 838. Their operation principles, connections and the modifications thereto can be understood by people having ordinary skill in the art, and are therefore omitted for brevity.

Figure 1:
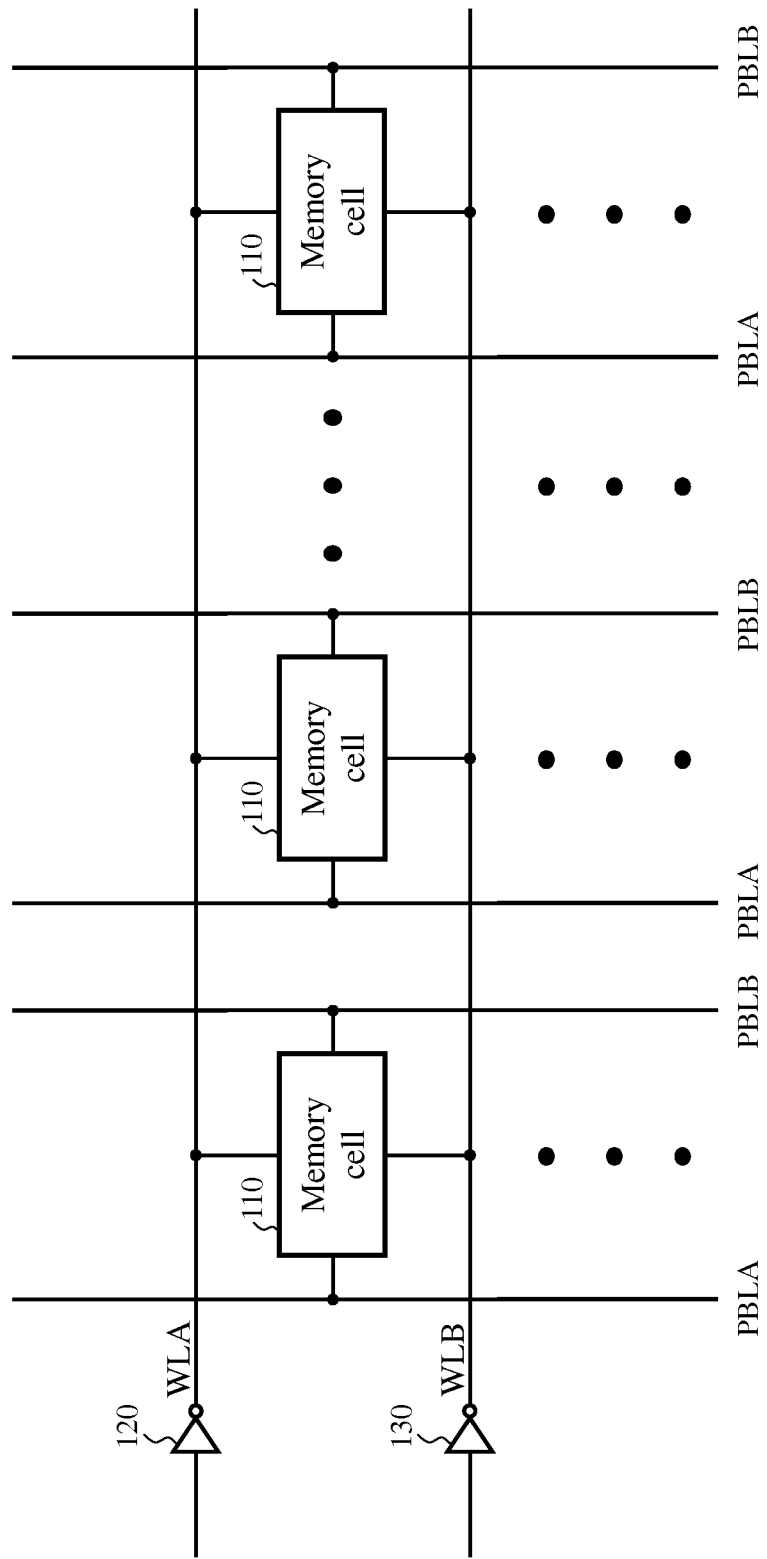
FIG. 1 illustrates a circuit of a conventional dual port SRAM module.
Figure 2:
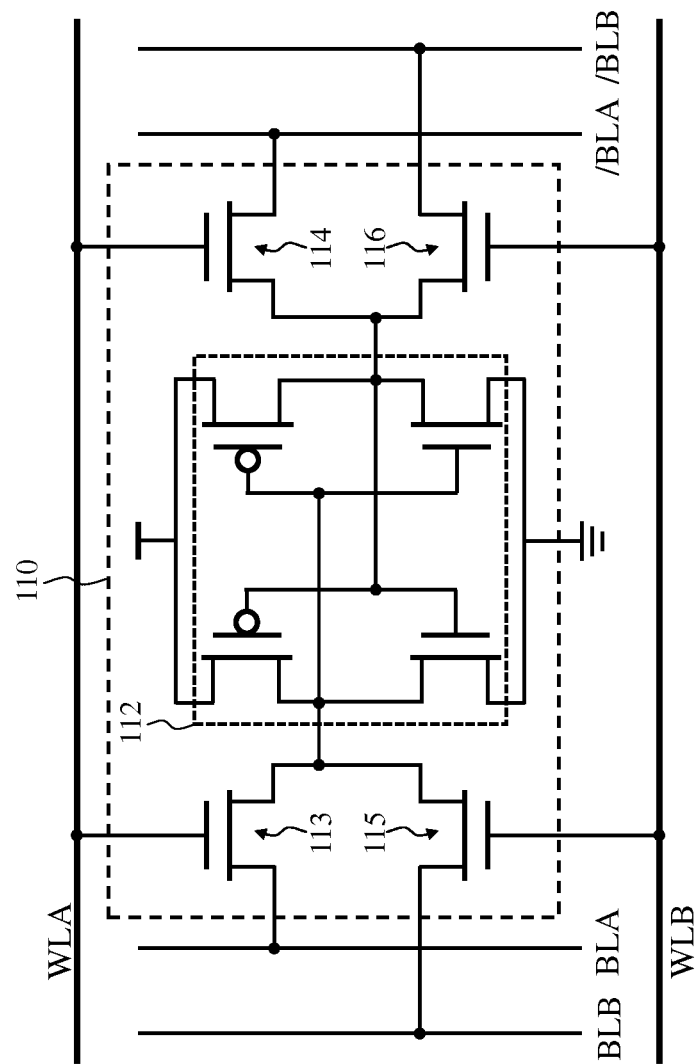
FIG. 2 illustrates a circuit of the dual port memory cell 110.
Figure 10:
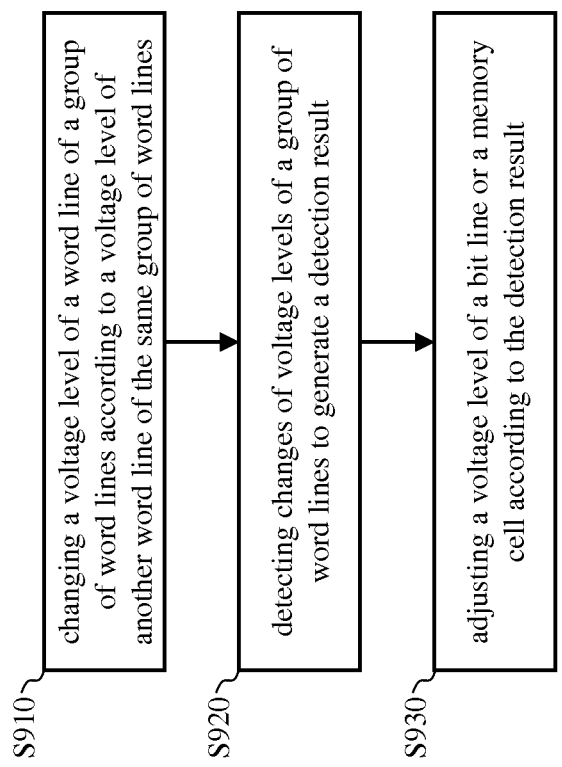
FIG. 10 illustrates a flowchart of a method of controlling a multi-port SRAM module according to an embodiment of the present invention.

FIG. 10 illustrates a flowchart of a method of controlling a multi-port SRAM module according to an embodiment of the present invention. The method includes the following steps:

Step S910: changing a voltage level of a word line of a group of word lines according to a voltage level of another word line of the same group of word lines. For example, in a dual port SRAM module as shown in FIG. 1, the dual port memory cells 110 of one row are controlled by a group of word lines that includes 2 word lines. In this step, when one of the word lines is enabled, the voltage level of another word line is changed, such as by lowering the voltage level during the enablement, to achieve an effect of the WLUD mechanism, which reduces read disturb of the dual port memory cell 110. In addition, this step can include the following details: determining whether to change the voltage level of the word line according to a read/write control signal. In one embodiment, the voltage level of the word line can be adjusted according to the design principles of the logic circuit 830;

Step S920: detecting changes of voltage levels of a group of word lines to generate a detection result. When at least 2 word lines of a group of word lines are enabled at the same time, the detection result reflects this state; and Step S930: adjusting a voltage level of a bit line or a memory cell according to the detection result. When at least 2 word lines of a group of word lines are enabled at the same time, the stability of the write operation can be improved by reducing the voltage level of the bit line (i.e., applying negative bit line), or the stability of the read operation can be improved by decreasing a low voltage level of the memory cell, which reduces the possibility of data flip of the memory cell.

The aforementioned embodiments can be combined. For example, the embodiment of FIG. 5 can be combined with the embodiment of FIG. 7 and/or FIG. 8, the embodiment of FIG. 9 can be combined with the embodiment of FIG. 7 and/or FIG. 8, or the embodiment of FIG. 3 can be combined with the embodiment of FIG. 7 and/or FIG. 8. Such combinations and the modifications thereto can be understood by people having ordinary skill in the art, and are therefore omitted for brevity. In the flowchart of FIG. 10, the step S910 can be implemented independently from the step S920 and the step S930.

Despite that only 2 word lines are illustrated in a multi-port SRAM module in the embodiments above, this invention can be applied to a SRAM module with more than 3 word lines. For example, the word line WLB is further coupled to the reference voltage level through another switch that switches on and off according to a voltage level of another word line WLC; or, the detection circuits in FIG. 7 or the voltage adjusting circuit in FIG. 8 may include another serially-connected switch that switches on and off according to a voltage level of another word line WLC.

Since people of ordinary skill in the art can appreciate the implementation detail and the modification thereto of the present method invention of FIG. 10 through the disclosure of the device invention of FIGS. 3-9, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are just exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A multi-port SRAM module, comprising:
   a memory cell array which comprises a plurality of memory cells, wherein each memory cell comprises at least a first port and a second port;
   a first word line, coupled to a plurality of memory cells of a target row, for controlling whether the first port is open or not;
   a second word line, coupled to the plurality of memory cells of the target row, for controlling whether the second port is open or not; and
   a switch, coupled to the first word line and the second word line, for determining whether to couple the second word line to a reference voltage level according to a voltage level of the first word line;
   wherein, when the first word line is disabled and the second word line is enabled, the second word line has a first enabling voltage level, and when the first word line and the second word line are enabled at the same time, the second word line has a second enabling voltage level different form the first enabling voltage level.

2. The multi-port SRAM module of claim 1 further comprising:
   a first inverter which drives the first word line and an output terminal of which is coupled to the first port; and
   a second inverter which drives the second word line and an output terminal of which is coupled to the second port;
   wherein the switch is a PMOS with a source coupled to one of the output terminal of the second inverter and the reference voltage level, a drain coupled to the other and a gate coupled to an input terminal of the first inverter.

3. The multi-port SRAM module of claim 1 further comprising:
   a first inverter which drives the first word line and an output terminal of which is coupled to the first port; and
   a second inverter which drives the second word line and an output terminal of which is coupled to the second port;
   wherein the switch is an NMOS with a source coupled to one of the output terminal of the second inverter and the reference voltage level, a drain coupled to the other and a gate coupled to the output terminal of the first inverter.

4. The multi-port SRAM module of claim 1 further comprising:
   an additional switch, coupled to the first word line and the second word line, for determining whether to couple the first word line to the reference voltage level according to a voltage level of the second word line.

5. The multi-port SRAM module of claim 4 further comprising:
   a logic circuit, coupled to the switch, the additional switch and the reference voltage level, for determining whether to couple at least one of the first word line and the second word line to the reference voltage level according to a first read/write control signal corresponding to the first port and a second read/write control signal corresponding to the second port.

6. The multi-port SRAM module of claim 1 further comprising:
   a detection circuit, coupled to the first word line and the second word line, for detecting the voltage levels of the first word line and the second word line to generate a detection result;
   wherein, according to the detection result, the voltage levels of the memory cells of the target row are adjusted or a voltage level of a bit line is adjusted, the bit line being connected to the first port or the second port.

7. The multi-port SRAM module of claim 1, wherein the second enabling voltage level is smaller than the first enabling voltage level.

8. A multi-port SRAM module, comprising:
   a memory cell array which comprises a plurality of memory cells, wherein each memory cell comprises at least a first port and a second port;
   a first word line, coupled to a plurality of memory cells of a target row, for controlling whether the first port is open or not;
   a second word line, coupled to the plurality of memory cells of the target row, for controlling whether the second port is open or not; and
   a detection circuit, coupled to the first word line and the second word line, for detecting the voltage levels of the first word line and the second word line to generate a detection result;
   wherein, according to the detection result, the voltage levels of the memory cells of the target row are adjusted or a voltage level of a bit line is adjusted, the bit line being connected to the first port or the second port.

9. The multi-port SRAM module of claim 8 further comprising:
   a write control circuit, which is coupled to the detection circuit and uses the bit line to perform a write operation on a part of the memory cells and adjusts the voltage level of the bit line according to the detection result.

10. The multi-port SRAM module of claim 8 further comprising:
    a voltage adjusting circuit, coupled to the detection circuit, for adjusting the voltage levels of the memory cells of the target row according to the detection result.

11. The multi-port SRAM module of claim 8 further comprising:
    a voltage adjusting circuit, coupled to the first word line and the second word line, for adjusting the voltage levels of the memory cells of the target row according directly to the voltage levels of the first word line and the second word line.

12. The multi-port SRAM module of claim 8, wherein the detection circuit comprises:
    a first transistor having a first control terminal, a first terminal and a second terminal, wherein the first control terminal is coupled to the first word line, and the first terminal is coupled to a reference voltage level; and
    a second transistor having a second control terminal, a third terminal and a fourth terminal, wherein the second control terminal is coupled to the second word line, the third terminal is coupled to the second terminal, and the fourth terminal outputs the detection result.

13. The multi-port SRAM module of claim 8 further comprising:
    a control line, coupled to the detection circuit, for transmitting the detection result; and a reset circuit, coupled to the control line, for resetting a voltage level of the control line between two consecutive events when the first word line and the second word line are simultaneously enabled.

14. A method of controlling a multi-port SRAM, the multi-port SRAM comprising a first word line and a second word line, the first word line and the second word line being respectively used to control whether or not a first port and a second port of a plurality of memory cells of the same row are open, the method comprising:
  adjusting a voltage level of the second word line according to a voltage level of the first word line;
  wherein, when the first word line is disabled and the second word line is enabled, the second word line has a first enabling voltage level, and when the first word line and the second word line are enabled at the same time, the second word line has a second enabling voltage level different from the first enabling voltage level.

15. The method of claim 14, further comprising:
  determining whether to change at least a voltage level of the first word line and the second word line according to a first read/write control signal corresponding to the first port and a second read/write control signal corresponding to the second port.

16. The method of claim 14, wherein each memory cell is coupled to a bit line and the method further comprises:
  detecting changes in the voltage levels of the first word line and the second word line to generate a detection result; and
  adjusting the voltage level of the bit line or the voltage levels of the memory cells according to the detection result.

17. The method of claim 14, wherein the second enabling voltage level is smaller than the first enabling voltage level.

* * * * *